US012567864B2

(12) United States Patent
Lin et al.

(10) Patent No.: US 12,567,864 B2
(45) Date of Patent: Mar. 3, 2026

(54) PHASE-LOCKED LOOP CIRCUIT USING HYBRID LOOP CALIBRATION SCHEME AND ADAPTIVELY UPDATED LOOKUP TABLES AND ASSOCIATED CLOCK GENERATING METHOD

(71) Applicant: Airoha Technology Corp., Hsinchu City (TW)

(72) Inventors: Heng-Chih Lin, Hsinchu City (TW); Shu-Yu Lin, New Taipei City (TW)

(73) Assignee: Airoha Technology Corp., Hsinchu City (TW)

( * ) Notice: Subject to any disclaimer, the term of this patent is extended or adjusted under 35 U.S.C. 154(b) by 337 days.

(21) Appl. No.: 17/751,679

(22) Filed: May 24, 2022

(65) Prior Publication Data

US 2023/0387920 A1     Nov. 30, 2023

(51) Int. Cl.
*H03L 7/091* (2006.01)
*H03L 1/02* (2006.01)
*H03L 7/099* (2006.01)

(52) U.S. Cl.
CPC .............. *H03L 7/091* (2013.01); *H03L 1/02* (2013.01); *H03L 7/099* (2013.01)

(58) Field of Classification Search
CPC . H03L 7/10; H03L 7/101; H03L 7/105; H03L 7/104; H03L 7/107; H03L 7/06; H03L 7/00; H03L 7/08; H03L 7/0805
See application file for complete search history.

(56) References Cited

U.S. PATENT DOCUMENTS

| | | | |
|---|---|---|---|
| 6,466,069 B1 | 10/2002 | Rozenblit | |
| 7,095,287 B2 * | 8/2006 | Maxim ................. | H03L 7/0898 331/25 |
| 9,191,056 B2 | 11/2015 | Shima | |
| 10,079,607 B1 | 9/2018 | Grens | |
| 11,418,204 B2 * | 8/2022 | Gupta .................... | H03L 7/093 |
| 2011/0260761 A1 | 10/2011 | Kearney | |
| 2016/0301415 A1 | 10/2016 | Waldrip | |

FOREIGN PATENT DOCUMENTS

| | | |
|---|---|---|
| CN | 106341122 A | 1/2017 |
| CN | 107846216 A | 3/2018 |
| TW | I449340 | 8/2014 |
| TW | 202130123 A | 8/2021 |

* cited by examiner

*Primary Examiner* — Diana J. Cheng
(74) *Attorney, Agent, or Firm* — Winston Hsu

(57) ABSTRACT

A phase-locked loop (PLL) circuit includes a PLL core circuit, at least one lookup table, and a control circuit. The PLL core circuit generates an output clock under an open-loop calibration phase and a closed-loop calibration phase. The control circuit loads PLL parameters that are derived from the at least one lookup table to the PLL core circuit, performs open-loop calibration upon a first part of the PLL parameters under the open-loop calibration phase of the PLL core circuit, and performs closed-loop calibration upon a second part of the PLL parameters under the closed-loop calibration phase of the PLL core circuit.

20 Claims, 4 Drawing Sheets

PHASE-LOCKED LOOP CIRCUIT USING HYBRID LOOP CALIBRATION SCHEME AND ADAPTIVELY UPDATED LOOKUP TABLES AND ASSOCIATED CLOCK GENERATING METHOD

BACKGROUND OF THE INVENTION

1. Field of the Invention

The present invention relates to clock generation, and more particularly, to a phase-locked loop circuit using a hybrid loop calibration scheme and adaptively updated lookup tables and an associated clock generating method.

2. Description of the Prior Art

Phase-locked loop (PLL) circuits are widely used in a variety of applications. For example, a PLL circuit can be employed by a Bluetooth (BT) application. Interference is one of the biggest challenges for any wireless technology in providing reliable communications. Since different wireless technologies, such as BT and wireless fidelity (Wi-Fi), may share the same transmission medium, it is possible for a packet that is being transmitted to be corrupted or lost if it collides with another packet being transmitted at the exact same time and on the same frequency channel. One of the techniques that BT technology uses to overcome interference and find a clear transmission path that avoids packet collision is frequency-hopping. In accordance with frequency-hopping, a BT system divides the frequency band into smaller channels (e.g., 40 channels), and rapidly hops between those channels when transmitting packets. For example, 625 us is needed for each hopping, and includes PLL's settling time and digital operating time. An inductor-capacitor (LC) tank based PLL circuit is usually used for the BT application, and needs capacitor bank calibration to cover the target frequency due to a small tuning range of a voltage-controlled oscillator (VCO). However, the PLL calibration may cost about 50% of PLL's settling time. Furthermore, a low phase noise requirement needs a small bandwidth of the PLL circuit, which makes PLL's settling time even longer.

Thus, there is a need for an innovative PLL design that can achieve low settling time while maintaining low phase noise.

SUMMARY OF THE INVENTION

One of the objectives of the claimed invention is to provide a phase-locked loop circuit using a hybrid loop calibration scheme and adaptively updated lookup tables and an associated clock generating method.

According to a first aspect of the present invention, an exemplary phase-locked loop (PLL) circuit is disclosed. The exemplary PLL circuit includes a PLL core circuit, at least one lookup table, and a control circuit. The PLL core circuit is arranged to generate an output clock under an open-loop calibration phase and a closed-loop calibration phase. The control circuit is arranged to load PLL parameters that are derived from the at least one lookup table to the PLL core circuit, perform open-loop calibration upon a first part of the PLL parameters under the open-loop calibration phase of the PLL core circuit, and perform closed-loop calibration upon a second part of the PLL parameters under the closed-loop calibration phase of the PLL core circuit.

According to a second aspect of the present invention, an exemplary clock generating method is disclosed. The exemplary clock generating method includes: deriving phase-locked loop (PLL) parameters from at least one lookup table; loading the PLL parameters to a PLL core circuit, wherein the PLL core circuit generates an output clock under an open-loop calibration phase and a closed-loop calibration phase; performing open-loop calibration upon a first part of the PLL parameters under the open-loop calibration phase of the PLL core circuit; and performing closed-loop calibration upon a second part of the PLL parameters under the closed-loop calibration phase of the PLL core circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
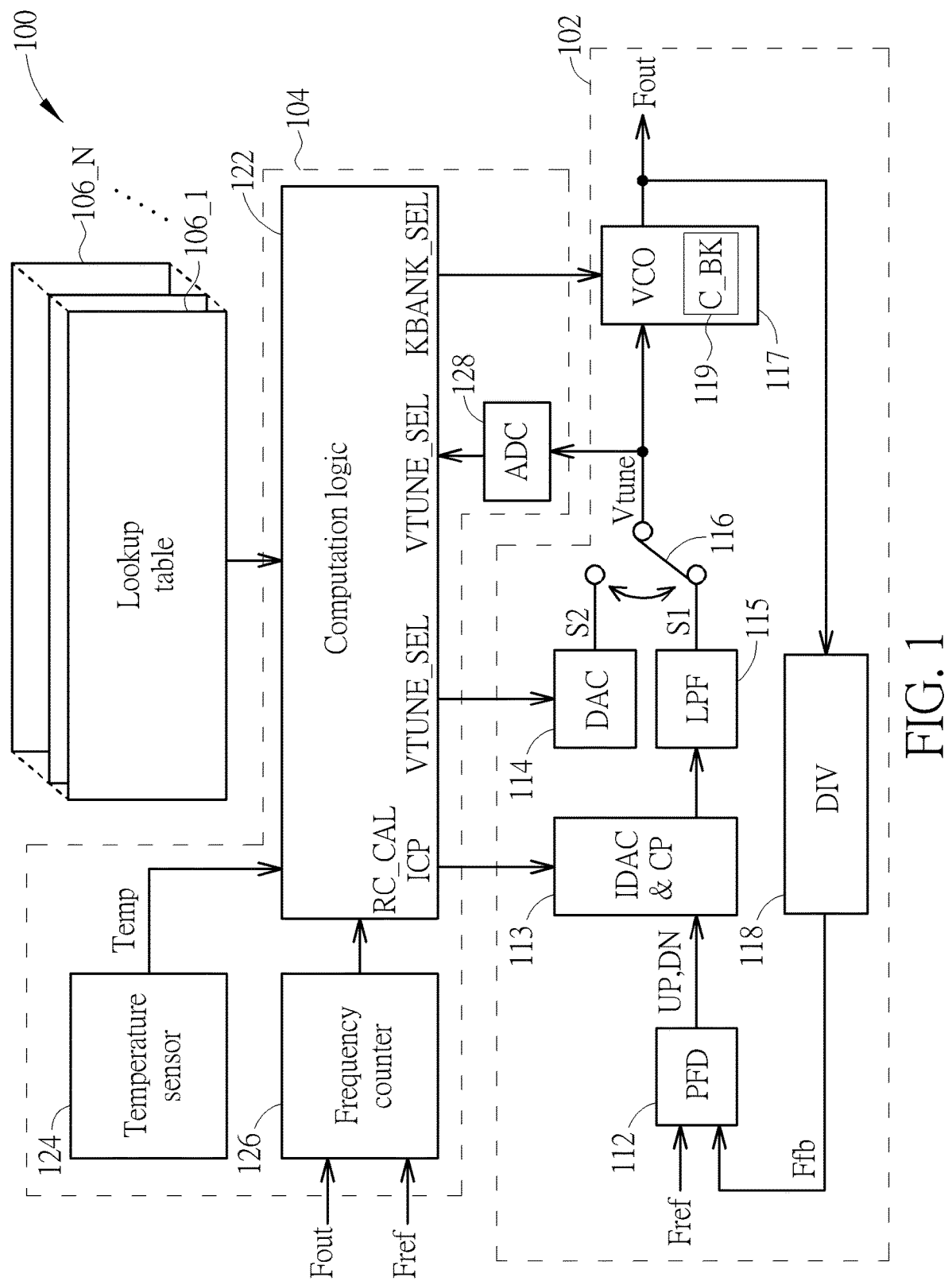
FIG. 1 is a diagram illustrating a phase-locked loop (PLL) circuit according to an embodiment of the present invention.

FIG. 1 is a diagram illustrating a phase-locked loop (PLL) circuit according to an embodiment of the present invention. By way of example, but not limitation, the PLL circuit 100 may be employed by a Bluetooth (BT) application. As shown in FIG. 1, the PLL circuit 100 may include a PLL core circuit 102, a control circuit 104, and one or more lookup tables 106_1-106_N (N≥1). In some embodiments of the present invention, a plurality of lookup tables 106_1-106_N (N>1) indexed by a plurality of different temperature values, respectively, may be established to compensate for temperature variation. For example, a lookup table indexed by a temperature value may have a plurality of table entries mapped to a plurality of BT channels within 2.4 GHz ISM Band, respectively, where each table entry records PLL parameters (e.g., KBANK_SEL, VTUNE_SEL, RC_CAL, and ICP) for a corresponding BT channel.

The PLL core circuit 102 may include a phase frequency detector (PFD) 112, a charge pump with a current digital-to-analog converter (labeled by "IDAC & CP") 113, a digital-to-analog converter (DAC) 114, a low-pass filter (LPF) 115, a switch circuit 116, a controllable oscillator (e.g., a voltage-controlled oscillator (VCO) 117), and a frequency divider (labeled by "DIV") 118. The VCO 117 generates an output clock with an output frequency Fout in response to a control input Vtune. The frequency divider 118 divides the output frequency Fout of the output clock to generate a feedback clock with a feedback frequency Ffb. The phase frequency detector 112 measures the phase and frequency difference between two signals, including the feedback clock with the feedback frequency Ffb and a reference clock with a reference frequency Fref, and provides control signals UP, DN to the charge pump 113. The charge pump 113 responds to the control signals UP, DN from the phase frequency detector 112, and outputs a current signal to the LPF 115. In this embodiment, the control input Vtune may be set in an open-loop manner or a closed-loop manner. For example, the LPF 115 is arranged to provide a first control signal S1 in response to the current output of the charge pump 113, the DAC 114 is arranged to provide a second control signal S2 in response to an oscillator control input setting VTUNE_SEL (which may be one of the PLL parameters obtained from at least one lookup table selected from the lookup tables 106_1-106_N), and the switch circuit 116 is arranged to select the second control signal S2 as the control input Vtune of the VCO 117 under an open-loop calibration phase of the PLL core circuit 102, and select the first control signal S1 as the control input Vtune of the VCO 117 under a closed-loop calibration phase of the PLL core circuit 102. More specifically, the control input Vtune is set by the DAC 114 at PLL startup (or start of hopping between different frequencies) and is set by the LPF 115 during a following PLL locking process. With the help of the DAC 114 that directly sets the control input Vtune of the VCO 117 at PLL startup (or start of hopping between different frequencies), the PLL circuit 100 (particularly, PLL core circuit 102 of PLL circuit 100) can settle faster.

The control circuit 104 may include a computation logic circuit (labeled by "Computation logic") 122, a temperature sensor 124, a frequency counter 126, and an analog-to-digital converter (ADC) 128. The computation logic circuit 122 may select at least one lookup table from the lookup tables 106_1-106_N in response to a temperature value Temp detected by the temperature sensor 124, or may establish a new lookup table in response to the temperature value Temp detected by the temperature sensor 124.

In a first case where none of the lookup tables 106_1-106_N is indexed by the temperature value Temp and none of the lookup tables 106_1-106_N is indexed by a temperature value adjacent to the temperature value Temp, the computation logic circuit 122 may establish a new lookup table indexed by the temperature value Temp through open-loop calibration and closed-loop calibration. The computation logic circuit 122 sets the oscillator control input setting VTUNE_SEL by a middle value of a tuning range of VCO 117, the switch circuit 116 selects the second control signal S2 as the control input Vtune of the VCO 117, the VCO 117 generates the output clock with the output frequency Fout under the open-loop calibration phase of the PLL core circuit 102, and the frequency counter 126 uses the reference clock with the reference frequency Fref to count the output clock with the output frequency Fout for generating a count value that indicates if the output frequency Fout is equal to or close to a target channel frequency. In this embodiment, the VCO 117 may be an LC tank based oscillator, and includes a capacitor bank (labeled by "C_BK") 119 with an adjustable capacitance value controlled by a bank selection setting KBANK_SEL. The computation logic circuit 122 refers to the count value provided by the frequency counter 126 to calibrate the bank selection setting KBANK_SEL, and finds a calibrated bank selection setting KBANK_SEL for the target channel frequency when the count value indicates that the output frequency Fout is equal to or close to the target channel frequency. After open-loop calibration of the bank selection setting KBANK_SEL is done, the computation logic circuit 122 enables closed-loop calibration of the oscillator control input setting VTUNE_SEL by instructing the switch circuit 116 to select the first control signal S1 as the control input Vtune of the VCO 117, and the VCO 117 generates the output clock with the output frequency Fout under the closed-loop calibration phase of the PLL core circuit 102. With the help of the closed-loop control, the control input Vtune is adaptively adjusted to make the output frequency Fout locked to the target channel frequency within a predefined tolerance. Hence, after the PLL circuit 100 (particularly, PLL core circuit 102 of PLL circuit 100) is settled, the ADC 128 converts the control input Vtune into a calibrated oscillator control input setting VTUNE_SEL for the target channel frequency. The bank selection setting KBANK_SEL and the oscillator control input setting VTUNE_SEL calibrated for the target channel frequency are recorded in the newly established lookup table indexed by the temperature value Temp. Based on the same procedure, the newly established lookup table indexed by the temperature value Temp can be populated with a plurality of table entries mapped to a plurality of different BT channels, respectively, where each table entry records PLL parameters (e.g., KBANK_SEL and VTUNE_SEL) for a corresponding BT channel.

In a second case where one of the lookup tables 106_1-106_N is indexed by the temperature value Temp, the computation logic circuit 122 selects the lookup table indexed by the temperature value Temp, and loads PLL parameters (e.g., KBANK_SEL and VTUNE_SEL) recorded in a table entry mapped to the target channel frequency to the PLL core circuit 102. Hence, the switch circuit 116 selects the second control signal S2 as the control input Vtune of the VCO 117, and the VCO 117 generates the output clock with the output frequency Fout under the open-loop calibration phase of the PLL core circuit 102. In addition, the frequency counter 126 can use the reference clock with the reference frequency Fref to count the output clock with the output frequency Fout for generating a count value that indicates if the output frequency Fout is equal to or close to the target channel frequency. If the count value indicates that the output frequency Fout is equal to or close to the target channel frequency, no open-loop calibration of the bank selection setting KBANK_SEL loaded from the lookup table indexed by the temperature value Temp is needed. If the count value indicates that the output frequency Fout is not equal to or close to the target channel frequency, the computation logic circuit 122 refers to the count value provided by the frequency counter 126 to calibrate the bank selection setting KBANK_SEL. The computation logic circuit 122 finds a calibrated bank selection setting KBANK_SEL for the target channel frequency when the count value indicates that the output frequency Fout is equal to or close to the target channel frequency. Next, the computation logic circuit 122 enables closed-loop calibration of the oscillator control input setting VTUNE_SEL by instructing the switch circuit 116 to select the first control signal S1 as the control input Vtune of the VCO 117, and the VCO 117 generates the output clock with the output frequency Fout under the closed-loop calibration phase of the PLL core circuit 102.

With the help of the closed-loop control, the control input Vtune is adaptively adjusted to make the output frequency Fout locked to the target channel frequency within a pre-defined tolerance. Hence, after the PLL circuit 100 (particularly, PLL core circuit 102 of PLL circuit 100) is settled, the ADC 128 converts the control input Vtune into a calibrated oscillator control input setting VTUNE_SEL for the target channel frequency. After the PLL circuit 100 (particularly, PLL core circuit 102 of PLL circuit 100) is settled, the lookup table indexed by the temperature value Temp is updated by the bank selection setting KBANK_SEL and the oscillator control input setting VTUNE_SEL calibrated for the target channel frequency. In some embodiments of the present invention, after the PLL circuit 100 (particularly, PLL core circuit 102 of PLL circuit 100) is settled, the computation logic circuit 122 may refer to the current PLL parameters (e.g., bank selection setting KBANK_SEL and the oscillator control input setting VTUNE_SEL calibrated for the target channel frequency) to update adjacent lookup table(s) (i.e. lookup table(s) indexed by temperature value(s) adjacent to the temperature value Temp) through interpolation/extrapolation.

In a third case where none of the lookup tables 106_1-106_N is indexed by the temperature value Temp and the lookup tables 106_1-106_N include lookup tables indexed by temperature values adjacent to the temperature value Temp, the computation logic circuit 122 selects a first lookup table indexed by a first temperature value adjacent to the temperature value Temp and a second lookup table indexed by a second temperature value adjacent to the temperature value Temp, and determines PLL parameters (e.g., KBANK_SEL and VTUNE_SEL) by performing interpolation/extrapolation upon PLL parameters (e.g., KBANK_SEL and VTUNE_SEL) recorded in a table entry of the first lookup table that is mapped to the target channel frequency and PLL parameters (e.g., KBANK_SEL and VTUNE_SEL) recorded in a table entry of the second lookup table that is mapped to the target channel frequency. For example, the first temperature value and the second temperature value are both higher than the temperature value Temp and are close to the temperature value Temp. For another example, the first temperature value and the second temperature value are both lower than the temperature value Temp and are close to the temperature value Temp. For yet another example, the temperature value Temp is close to both of the first temperature value and the second temperature value, where the temperature value Temp is higher than one of the first temperature value and the second temperature value, and is lower than the other of the first temperature value and the second temperature value.

The computation logic circuit 122 loads PLL parameters (e.g., KBANK_SEL and VTUNE_SEL) obtained by interpolation/extrapolation to the PLL core circuit 102. Hence, the switch circuit 116 selects the second control signal S2 as the control input Vtune of the VCO 117, and the VCO 117 generates the output clock with the output frequency Fout under the open-loop calibration phase of the PLL core circuit 102. In addition, the frequency counter 126 can use the reference clock with the reference frequency Fref to count the output clock with the output frequency Fout for generating a count value that indicates if the output frequency Fout is equal to or close to the target channel frequency. If the count value indicates that the output frequency Fout is equal to or close to the target channel frequency, no open-loop calibration of the bank selection setting KBANK_SEL is needed. If the count value indicates that the output frequency Fout is not equal to or close to the target channel frequency, the computation logic circuit 122 refers to the count value provided by the frequency counter 126 to calibrate the bank selection setting KBANK_SEL. The computation logic circuit 122 finds a calibrated bank selection setting KBANK_SEL for the target channel frequency when the count value indicates that the output frequency Fout is equal to or close to the target channel frequency. Next, the computation logic circuit 122 enables closed-loop calibration of the oscillator control input setting VTUNE_SEL by instructing the switch circuit 116 to select the first control signal S1 as the control input Vtune of the VCO 117, and the VCO 117 generates the output clock with the output frequency Fout under the closed-loop calibration phase of the PLL core circuit 102. With the help of the closed-loop control, the control input Vtune is adaptively adjusted to make the output frequency Fout locked to the target channel frequency within a predefined tolerance. Hence, after the PLL circuit 100 (particularly, PLL core circuit 102 of PLL circuit 100) is settled, the ADC 128 converts the control input Vtune into a calibrated oscillator control input setting VTUNE_SEL for the target channel frequency. In some embodiments of the present invention, after the PLL circuit 100 (particularly, PLL core circuit 102 of PLL circuit 100) is settled, the computation logic circuit 122 may refer to the current PLL parameters (e.g., bank selection setting KBANK_SEL and the oscillator control input setting VTUNE_SEL calibrated for the target channel frequency) to update one or both of the first lookup table indexed by the first temperature value and the second lookup table indexed by the second temperature through interpolation/extrapolation.

The proposed hybrid loop calibration scheme can adaptively calibrate and update PLL parameters recorded in the lookup tables 106_1-106_N to compensate for process and temperature variation. By loading PLL parameters derived from calibrated PLL parameters recorded in at least one lookup table to the PLL core circuit 102, the PLL's settling time can be shortened greatly.

In a conventional design, a low phase noise requirement needs a small bandwidth of the PLL circuit, which makes PLL's settling time longer. To address this issue, the present invention further proposes a turbo locking scheme which enables a high loop bandwidth at PLL startup and enables a low loop bandwidth for PLL locking. In some embodiments of the present invention, the PLL parameters (which may be directly retrieved from a single lookup table or may be obtained from multiple lookup tables through interpolation/extrapolation) loaded to the PLL core circuit 102 may further include a current value setting ICP and a resistor-capacitor (RC) value setting RC_CAL. The current value setting ICP may include an initial current value $I_{init}$ for quick PLL startup and a final current value $I_{final}$ ($I_{final}$<$I_{init}$) for low phase noise PLL locking.

Figure 2:
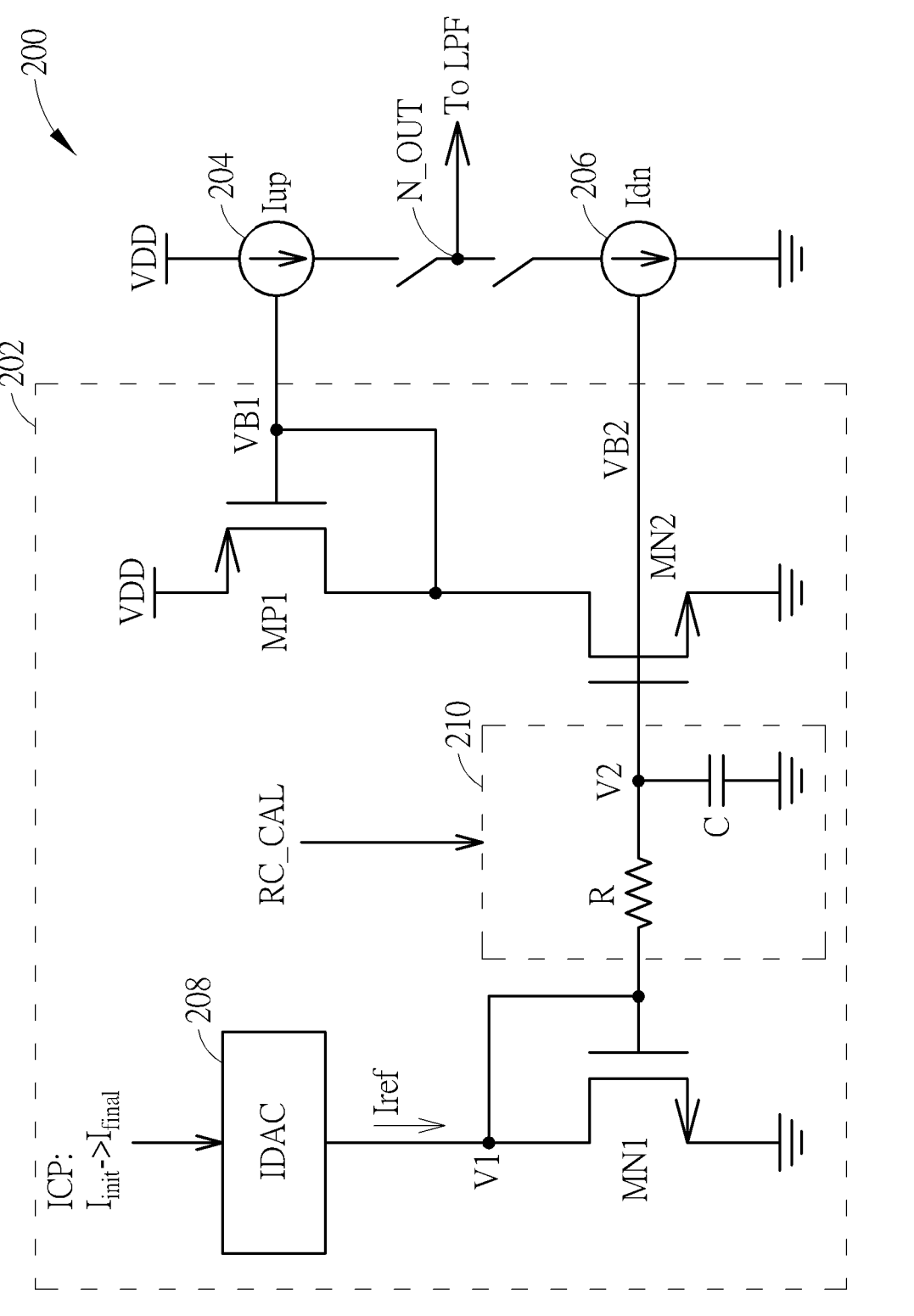
FIG. 2 is a diagram illustrating a charge pump of a PLL circuit according to an embodiment of the present invention.
Figure 3:
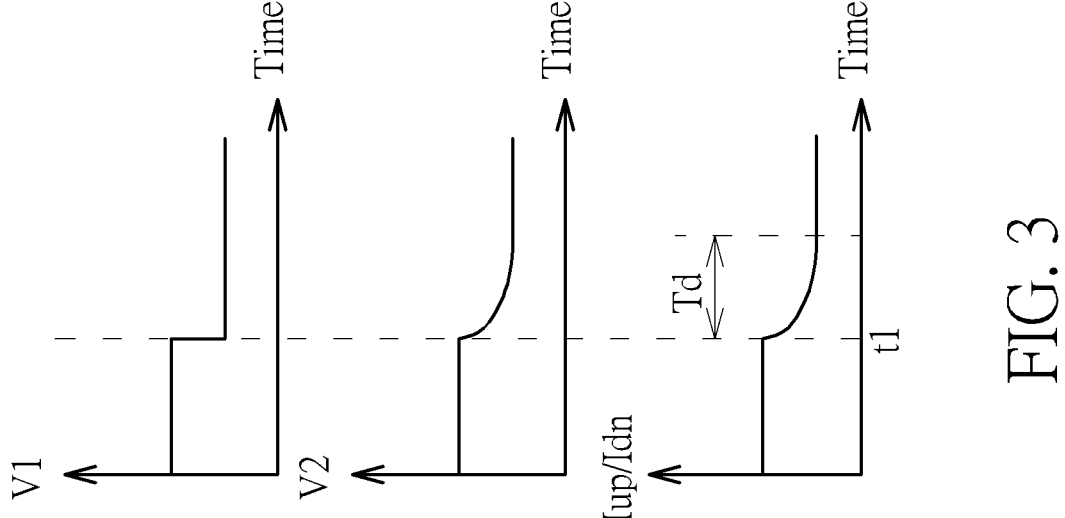
FIG. 3 is a timing diagram of the first voltage V1, the second voltage V2, the source current Iup, and the sink current Idn shown in FIG. 2 according to an embodiment of the present invention.

FIG. 2 is a diagram illustrating a charge pump of a PLL circuit according to an embodiment of the present invention. The charge pump 113 shown in FIG. 1 may be implemented by the charge pump 200 shown in FIG. 2. The charge pump 200 may include a biasing circuit 202, a current source circuit 204, and a current sink circuit 206. The current source circuit 204 is arranged to provide a source current Iup for charging an output node N OUT of the charge pump 200, wherein the source current Iup is controlled by a first bias voltage VB1 applied to the current source circuit 204 via the biasing circuit 202. The current sink circuit 206 is arranged to provide a sink current Idn for discharging the output node N OUT of the charge pump 200, wherein the sink current Idn is controlled by a second bias voltage VB2 applied to the current sink circuit 206 via the biasing circuit 202. The biasing circuit 202 is implemented on the basis of a current mirror structure, and includes a P-type metal-oxide-semiconductor (PMOS) transistor MP1, a plurality of N-type metal-oxide-semiconductor (NMOS) transistors MN1, MN2, a current digital-to-analog converter (IDAC) 208, and a low-pass filter 210. The IDAC 208 is arranged to provide a reference current Iref in response to the current value setting ICP, wherein a first voltage V1 is established due to the reference current Iref passing through the NMOS transistor MN1. The low-pass filter 210 includes a resistor R and a capacitor C, and is arranged to apply low-pass filtering to the first voltage V1 for generating a filter output as a second voltage V2, wherein the first bias voltage VB1 and the second bias voltage VB2 are both controlled by the second voltage V2. For example, VB1=VB2=V2. Before the PLL circuit 100 (particularly, PLL core circuit 102 of PLL circuit 100) is settled, the current value setting ICP is switched from a large current value (i.e. initial current value $I_{init}$) to a small current value (i.e. final current value $I_{final}$) for reducing the PLL loop bandwidth to meet the low phase noise requirement. If both of the source current Iup and the sink current Idn have an abrupt change due to an abrupt change of the reference current Iref, the PLL locking process may fail to benefit from an abrupt change of the PLL loop bandwidth. To address this issue, the low-pass filter 210 is used to make the second voltage V2 have a sliding decrease (i.e. smooth change) in response to switching of the current value setting ICP from the large current value (i.e. initial current value $I_{init}$) to the small current value (i.e. final current value $I_{final}$). Since the first bias voltage VB1 and the second bias voltage VB2 are both controlled by the second voltage V2 (i.e. filter output of the low-pass filter 210), each of the first bias voltage VB1 and the second bias voltage VB2 also has a sliding decrease (i.e. smooth change). In this way, each of the source current Iup and the sink current Idn gradually decreases to a lower current value (i.e. final current value $I_{final}$) FIG. 3 is a timing diagram of the first voltage V1, the second voltage V2, the source current Iup, and the sink current Idn shown in FIG. 2 according to an embodiment of the present invention. At the time point t1, the current value setting ICP is switched from the large current value (i.e. initial current value $I_{init}$) to the small current value (i.e. final current value $I_{final}$) The first voltage V1 has an abrupt change in response to an abrupt change of the reference current Iref output from the IDAC 208. Since the second voltage V2 is a filter output of the low-pass filter 210, the second voltage V2 has a sliding decrease. Since the second voltage V2 has a sliding decrease, the source current Iup/sink current Idn also has a sliding decrease during the current changing time Td. Since the PLL loop bandwidth gradually decreases to a lower value without jeopardizing the PLL locking process, the PLL circuit can achieve low settling time while maintaining low phase noise.

Each of the source current Iup and the sink current Idn mirrors the reference current Iref through the current mirror structure. In other words, the PLL loop bandwidth is positively correlated with the reference current Iref provided by the IDAC 208 under control of the current value setting ICP. In addition, when the current value setting ICP is switched from the large current value (i.e. initial current value $I_{init}$) to the small current value (i.e. final current value $I_{final}$), the RC time constant possessed by the low-pass filter 210 decides the current changing time Td of each of the source current Iup and the sink current Idn. However, the IDAC 208 and the low-pass filter 210 include analog components that may suffer from process and temperature variation. That is, the reference current Iref provided by the IDAC 208 may be deviated from an expected value due to process and temperature variation, the resistance value of the resistor R included in the low-pass filter 210 may be deviated from an expected value due to process and temperature variation, and/or the capacitance value of the capacitor C included in the low-pass filter 210 may be deviated from an expected value due to process and temperature variation. As a result, the lock time of the PLL circuit may not be well controlled, and the frequency-hopping performance of the BT system may be degraded. To address this issue, the current value setting ICP (which includes the initial current value $I_{init}$ and the final current value $I_{final}$) and/or the RC value setting RC_CAL (which includes the resistance value of the variable resistor R and the capacitance value of the variable capacitor C) may be calibrated to compensate for process and temperature variation. It should be noted that any well-known means capable of measuring current deviation, resistance deviation, and capacitance deviation can be adopted for calibrating the current value setting ICP and the RC value setting RC_CAL to compensate for process and temperature variation. Furthermore, the current value setting ICP and/or the RC value setting RC_CAL are derived from at least one lookup table, and the at least one lookup table is selected from lookup tables 106_1_106_N that are indexed by different temperature values, respectively. For example, when one of the lookup tables 106_1-106_N is indexed by the temperature value Temp, the computation logic circuit 122 selects the lookup table indexed by the temperature value Temp, and loads PLL parameters (e.g., KBANK_SEL, VTUNE_SEL, RC_CAL, and ICP) recorded in a table entry mapped to the target channel frequency to the PLL core circuit 102. For another example, when none of the lookup tables 106_1-106_N is indexed by the temperature value Temp and the lookup tables 106_1-106_N include lookup tables indexed by temperature values adjacent to the temperature value Temp, the computation logic circuit 122 determines PLL parameters (e.g., KBANK_SEL, VTUNE_SEL, RC_CAL, and ICP) to be loaded to the PLL core circuit 102 by performing interpolation/extrapolation upon PLL parameters (e.g., KBANK_SEL, VTUNE_SEL, RC_CAL, and ICP) recorded in a table entry of one lookup table that is mapped to the target channel frequency and PLL parameters (e.g., KBANK_SEL, VTUNE_SEL, RC_CAL, and ICP) recorded in a table entry of another lookup table that is mapped to the target channel frequency.

Since the RC value setting RC_CAL is calibrated to compensate for process and temperature variation, the RC time constant possessed by the low-pass filter 210 can be ensured to be a constant value, thus resulting in precise current changing time Td. In addition, since the current value setting ICP is calibrated to compensate for process and temperature variation, the high PLL loop bandwidth can be equalized to be constant, and the low PLL loop bandwidth can be equalized to be constant. Hence, the frequency-hopping performance of the BT system can be guaranteed through the precisely controlled lock time of the PLL circuit 100.

Figure 4:
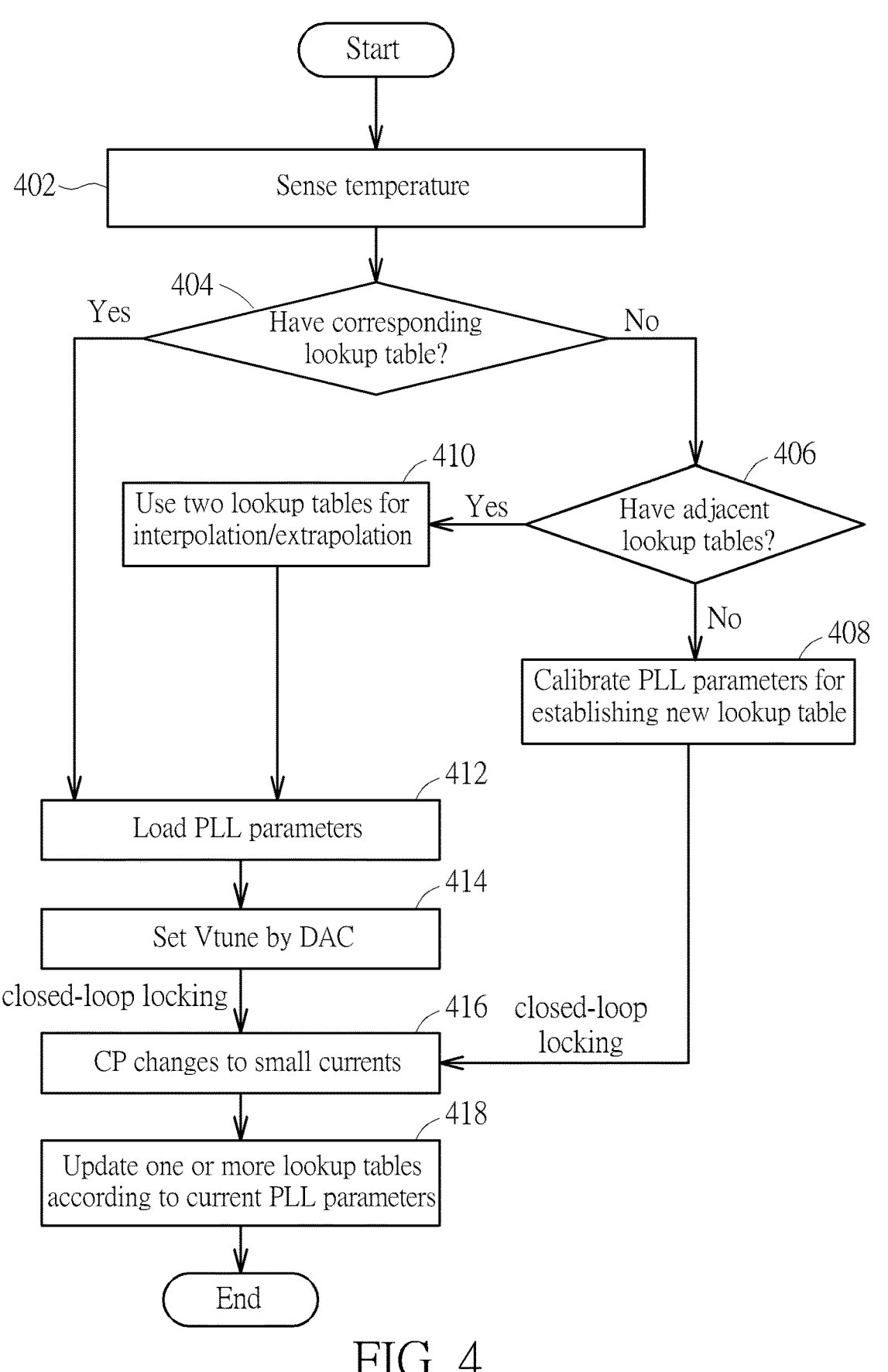
FIG. 4 is a flowchart illustrating a clock generating method according to an embodiment of the present invention.

FIG. 4 is a flowchart illustrating a clock generating method according to an embodiment of the present invention. The clock generating method may be employed by the PLL circuit 100 shown in FIG. 1. Provided that the result is substantially the same, the steps are not required to be executed in the exact order shown in FIG. 4. At step 402, the temperature sensor 124 detects the current temperature to generate a temperature value Temp. At step 404, the computation logic circuit 122 checks if a corresponding lookup table indexed by the temperature value Temp exists. If yes, the flow proceeds with step 412. If no, the flow proceeds with step 406. At step 406, the computation logic circuit 122 checks if adjacent lookup tables (i.e., lookup tables indexed by adjacent temperature values) exist. If yes, the flow proceeds with step 410. If no, the flow proceeds with step 408. At step 408, the computation logic circuit 122 performs open-loop PLL parameter calibration and closed-loop PLL parameter calibration for establishing a new lookup table indexed by the temperature value Temp. At step 410, the computation logic circuit 122 uses two lookup tables to derive PLL parameters from interpolation/extrapolation. At step 412, the computation logic circuit 122 loads the PLL parameters to the PLL core circuit 102. At step 414, the control input Vtune of VCO 117 is set by DAC 114. Closed-loop locking is enabled after step 408/414 is done. At step 416, the charge pump 113 uses smaller current (Iup, Idn) for lower PLL loop bandwidth. At step 418, the computation logic circuit 122 updates at least one lookup table (e.g., a lookup table indexed by the temperature value Temp and/or lookup tables indexed by adjacent temperature values) according to the current PLL parameters. Since a person skilled in the art can readily understand details of the steps show in FIG. 4 after reading above paragraphs directed to embodiments shown in FIG. 1 and FIG. 2, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase-locked loop (PLL) circuit comprising:
a PLL core circuit, arranged to generate an output clock under an open-loop calibration phase and a closed-loop calibration phase;
at least one lookup table; and
a control circuit, arranged to load PLL parameters that are derived from the at least one lookup table to the PLL core circuit, perform open-loop calibration upon a first part of the PLL parameters under the open-loop calibration phase of the PLL core circuit, and perform closed-loop calibration upon a second part of the PLL parameters under the closed-loop calibration phase of the PLL core circuit, wherein the first part of the PLL parameters that is calibrated by the open-loop calibration comprises a first PLL parameter, the second part of the PLL parameters that is calibrated by the closed-loop calibration comprises a second PLL parameter, the first PLL parameter and the second PLL parameter are different, and the first PLL parameter and the second PLL parameter are applied to different circuits included in the PLL core circuit.

2. The PLL circuit of claim 1, wherein the PLL circuit comprises:
a plurality of lookup tables, indexed by a plurality of different temperature values, respectively;
the control circuit comprises:
a temperature sensor; and
a computation logic circuit, arranged to select the at least one lookup table from the plurality of lookup tables in response to a temperature value detected by the temperature sensor.

3. The PLL circuit of claim 2, wherein the at least one lookup table comprises a first lookup table indexed by a first temperature value, and the temperature value detected by the temperature sensor is equal to the first temperature value.

4. The PLL circuit of claim 3, wherein after the PLL core circuit is settled under the closed-loop calibration phase, the computation logic circuit is further arranged to update the PLL parameters recorded in the first lookup table.

5. The PLL circuit of claim 3, wherein after the PLL core circuit is settled under the closed-loop calibration phase, the computation logic circuit is further arranged to update PLL parameters recorded in a second lookup table through interpolation or extrapolation, where the second lookup table is indexed by a second temperature value.

6. The PLL circuit of claim 2, wherein the temperature value detected by the temperature sensor is different from any of the plurality of different temperature values, the at least one lookup table comprises a first lookup table indexed by a first temperature value and a second lookup table indexed by a second temperature value, and the PLL parameters are derived from the first lookup table and the second lookup table through interpolation or extrapolation.

7. The PLL circuit of claim 6, wherein after the PLL core circuit is settled under the closed-loop calibration phase, the computation logic circuit is further arranged to update PLL parameters recorded in at least one of the first lookup table and the second lookup table through interpolation or extrapolation.

8. The PLL circuit of claim 1, wherein the PLL core circuit comprises:
a low-pass filter, arranged to provide a first control signal in response to an output of a charge pump;
a digital-to-analog converter, arranged to provide a second control signal in response to an oscillator control input setting included in the PLL parameters;
a controllable oscillator; and
a switch circuit, arranged to select the second control signal as a control input of the controllable oscillator under the open-loop calibration phase of the PLL core circuit, and select the first control signal as the control input of the controllable oscillator under the closed-loop calibration phase of the PLL core circuit.

9. The PLL circuit of claim 8, wherein the second part of the PLL parameters comprises the oscillator control input setting.

10. The PLL circuit of claim 1, wherein the PLL core circuit comprises a controllable oscillator, the controllable oscillator comprises a capacitor bank, and the first part of the PLL parameters comprises a bank selection setting of the capacitor bank.

11. A clock generating method comprising:
deriving phase-locked loop (PLL) parameters from at least one lookup table;
loading the PLL parameters to a PLL core circuit, wherein the PLL core circuit generates an output clock under an open-loop calibration phase and a closed-loop calibration phase;
performing open-loop calibration upon a first part of the PLL parameters under the open-loop calibration phase of the PLL core circuit; and
performing closed-loop calibration upon a second part of the PLL parameters under the closed-loop calibration phase of the PLL core circuit, wherein the first part of the PLL parameters that is calibrated by the open-loop calibration comprises a first PLL parameter, the second part of the PLL parameters that is calibrated by the closed-loop calibration comprises a second PLL parameter different, the first PLL parameter and the second PLL parameter are different, and the first PLL parameter and the second PLL parameter are applied to different circuits included in the PLL core circuit.

12. The clock generating method of claim 11, wherein deriving the PLL parameters from the at least one lookup table comprises:

establishing a plurality of lookup tables, indexed by a plurality of different temperature values, respectively;

detecting a temperature value by a temperature sensor;

selecting the at least one lookup table from the plurality of lookup tables in response to the temperature value detected by the temperature sensor.

13. The clock generating method of claim 12, wherein the at least one lookup table comprises a first lookup table indexed by a first temperature value, and the temperature value detected by the temperature sensor is equal to the first temperature value.

14. The clock generating method of claim 13, further comprising:

after the PLL core circuit is settled under the closed-loop calibration phase, updating the PLL parameters recorded in the first lookup table.

15. The clock generating method of claim 13, further comprising:

after the PLL core circuit is settled under the closed-loop calibration phase, updating PLL parameters recorded in a second lookup table through interpolation or extrapolation, wherein the second lookup table is indexed by a second temperature value.

16. The clock generating method of claim 12, wherein the temperature value detected by the temperature sensor is different from any of the plurality of different temperature values, the at least one lookup table comprises a first lookup table indexed by a first temperature value and a second lookup table indexed by a second temperature value, and the PLL parameters are derived from the first lookup table and the second lookup table through interpolation or extrapolation.

17. The clock generating method of claim 16, further comprising:

after the PLL core circuit is settled under the closed-loop calibration phase, updating PLL parameters recorded in at least one of the first lookup table and the second lookup table through interpolation or extrapolation.

18. The clock generating method of claim 11, wherein performing the closed-loop calibration upon the second part of the PLL parameters under the closed-loop calibration phase of the PLL core circuit comprises:

selecting a first control signal provided from a low-pass filter in response to an output of a charge pump as a control input of a controllable oscillator;

performing the open-loop calibration upon the first part of the PLL parameters under the open-loop calibration phase of the PLL core circuit comprises:

selecting a second control signal provided from a digital-to-analog converter in response to an oscillator control input setting included in the PLL parameters as the control input of the controllable oscillator.

19. The clock generating method of claim 18, wherein the second part of the PLL parameters comprises the oscillator control input setting.

20. The clock generating method of claim 11, wherein the PLL core circuit comprises a controllable oscillator, the controllable oscillator comprises a capacitor bank, and the first part of the PLL parameters comprises a bank selection setting of the capacitor bank.

* * * * *